United States Patent [19]

Imamura et al.

[11] Patent Number: 4,803,373

[45] Date of Patent: Feb. 7, 1989

[54] CONVEYOR ARM APPARATUS WITH GAP DETECTION

[75] Inventors: Kazunori Imamura, Tokyo; Fuminori Hayano, Fujisawa; Yukio Kakizaki, Yokohama; Jiro Kobayashi, Yamato, all of Japan

[73] Assignee: Nikon Corporation, Tokyo, Japan

[21] Appl. No.: 7,190

[22] Filed: Jan. 27, 1987

[30] Foreign Application Priority Data

Jan. 29, 1986 [JP] Japan .................................. 61-17250

[51] Int. Cl.4 ........................ G01N 21/86; G01V 9/04
[52] U.S. Cl. .................................. 250/561; 250/222.1; 250/223 R; 414/331
[58] Field of Search ................. 250/223 R, 561, 222.1, 250/221; 414/331; 340/555, 556, 557

[56] References Cited

U.S. PATENT DOCUMENTS

| 3,502,232 | 3/1970 | Hartman III ................... 250/223 R |
| 3,566,135 | 2/1971 | Mouchart ........................ 250/223 R |
| 3,612,884 | 10/1971 | Linardos et al. ................ 250/222.1 |
| 3,672,470 | 6/1972 | Ohntrup et al. ................. 250/222.1 |
| 3,681,607 | 8/1972 | Hartman III ................... 250/223 R |
| 3,902,615 | 9/1975 | Levy et al. ......................... 414/331 |
| 3,932,763 | 1/1976 | Weinstein ........................ 250/222.1 |
| 4,252,250 | 2/1981 | Toth ................................. 250/223 R |
| 4,437,660 | 3/1984 | Tompkins et al. ............... 250/223 R |

Primary Examiner—David C. Nelms
Assistant Examiner—Michael Messinger
Attorney, Agent, or Firm—Shapiro and Shapiro

[57] ABSTRACT

A conveyor arm apparatus unloads one by one a plurality of wafers which are stored in a holding chamber such that a surface of one wafer faces a back surface of another wafer at a predetermined distance. Two beams parallel to a semiconductor wafer mounting surface of a conveyor arm are projected into the holding chamber and the two beams passing through a gap between adjacent wafers are detected. Thus, the relative position of the conveyor arm and the wafers in the holding chamber can be confirmed.

32 Claims, 8 Drawing Sheets

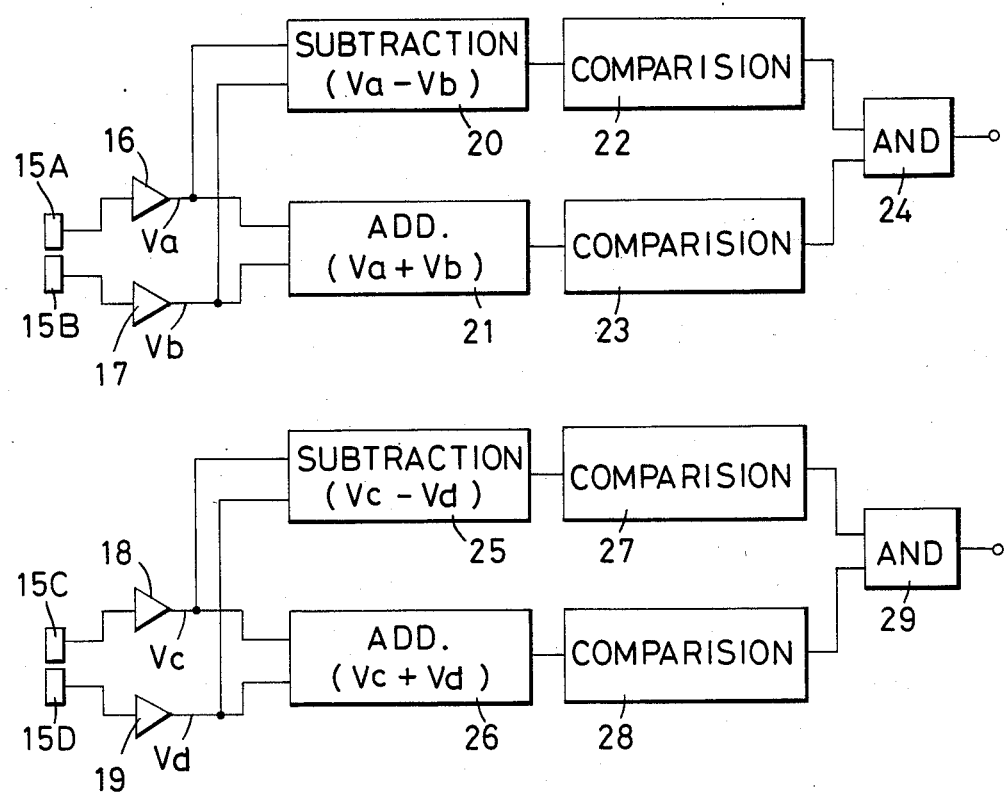

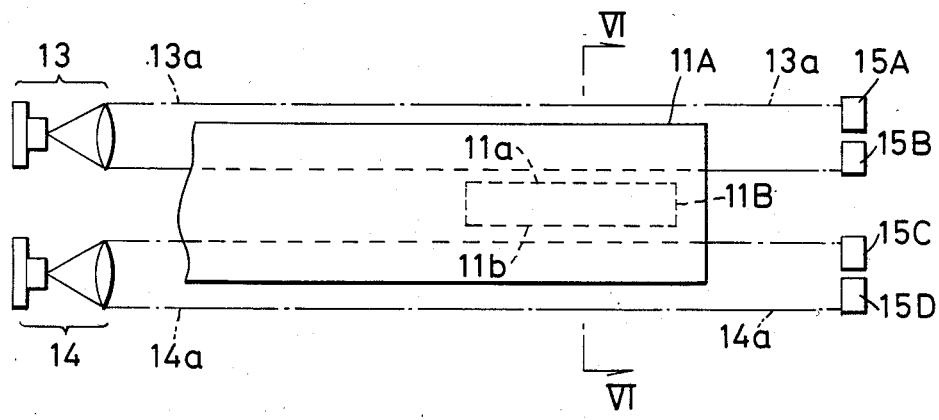
F I G. 5
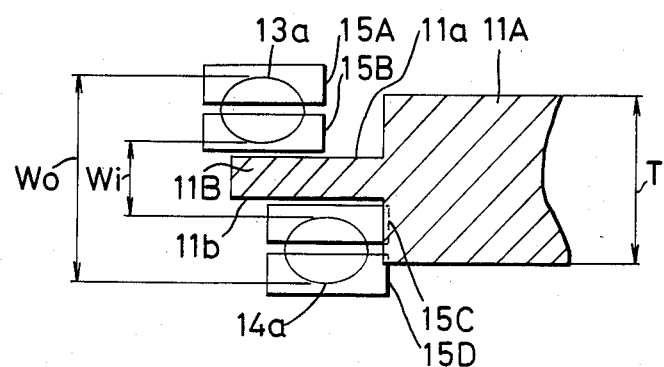
F I G. 6

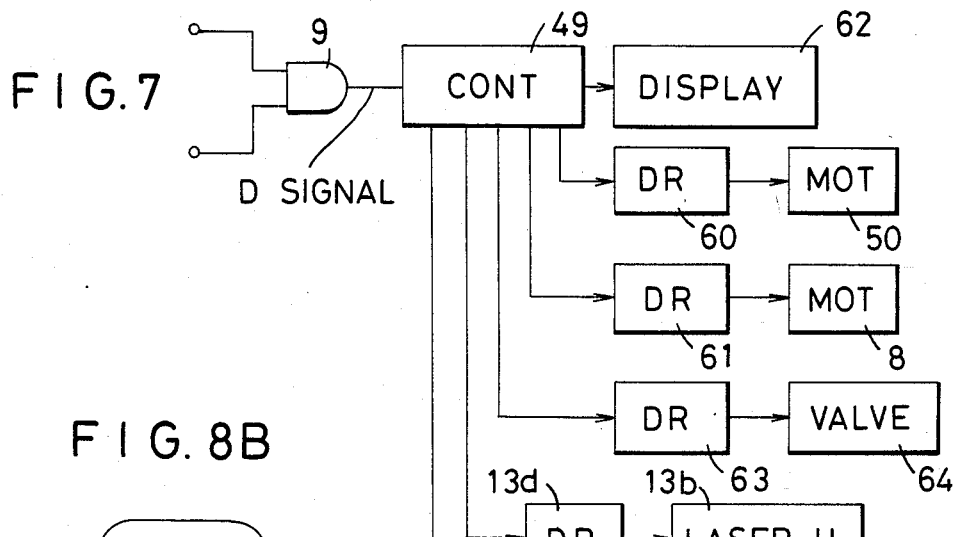

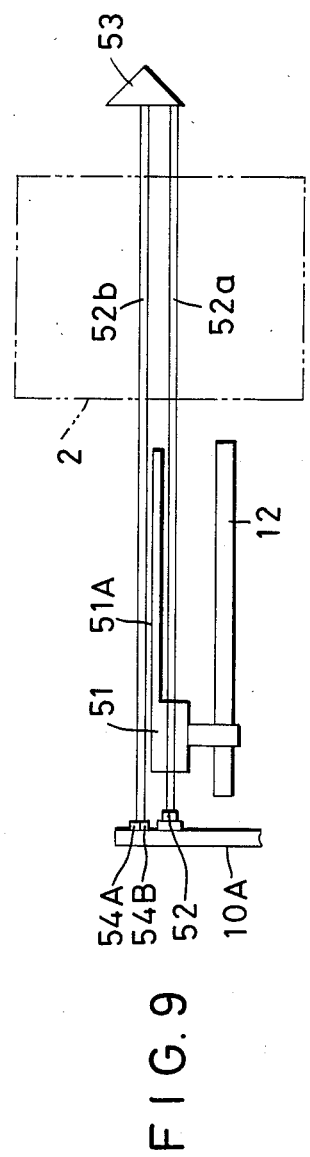
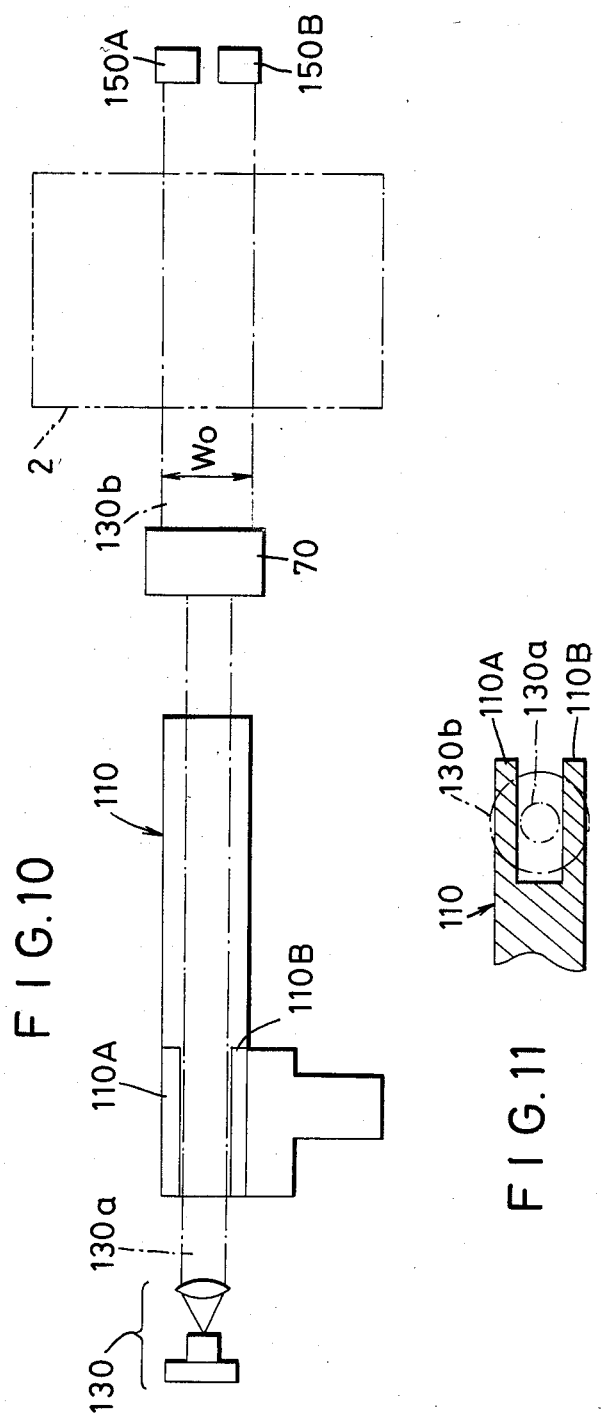
FIG. 9
FIG. 10
FIG. 11

CONVEYOR ARM APPARATUS WITH GAP DETECTION

BACKGROUND OF THE INVENTION

1. Field of the Invention

The present invention relates to a conveyor apparatus for a semiconductor wafer and, more particularly, to a conveyor arm apparatus for a semiconductor wafer, for unloading a semiconductor wafer from a holding chamber and conveying it and for conveying a processed semiconductor wafer and storing it in the holding chamber.

2. Related Background Art

Semiconductor wafers (to be referred to simply as "wafers" hereinafter) used for manufacturing semiconductor elements are often stored in a holding chamber (a so-called a wafer carrier) and are conveyed and processed step by step. For example, in a photolithography process, a plurality of wafers which are stored in the wafer carrier and conveyed to a predetermined position of an exposure apparatus are unloaded from the wafer carrier one by one, and are conveyed on the optical axis of the exposure apparatus. In this case, a method is known wherein wafers are unloaded from the wafer carrier using a plate-like arm (a so-called conveyor arm). With this method, a desired wafer in the wafer carrier can be loaded or unloaded. Therefore, this method is very convenient for the manufacturing process of a semiconductor element in which wafers must be frequently exchanged.

The conveyor arm is inserted between one wafer and a vertically adjacent wafer which are stored in a plurality of racks (or grooves) formed in the two side walls of the wafer carrier. In this case, since the distance between wafers is narrow (normally, about 3 mm to 9 mm), the conveyor arm may contact wafers. Therefore, in order to insert the arm without contacting wafers, a rack distance of the wafer carrier, the thickness of a wafer itself, and the insertion position of the arm must be precisely determined. If wafers are not properly placed on the racks (or grooves) of the wafer carrier, of if the insertion position of the conveyor arm has drifted or the arm is bent, the conveyor arm contacts the upper or lower surface of a wafer during insertion, and this causes generation of dust. In the worst case, the wafer may be damaged.

SUMMARY OF THE INVENTION

It is an object of the present invention to provide a semiconductor wafer conveyor apparatus which can safely, quickly, and reliably load and unload a wafer to and from a wafer carrier.

According to the present invention, there is provided a conveyor arm apparatus for loading one by one a plurality of wafers which are stored in a holding chamber such that a surface of one wafer faces a back surface of another wafer at a predetermined distance. In this apparatus, two beams parallel to a semiconductor wafer mounting surface of a conveyor arm are projected into the holding chamber, and the two beams passing through a gap between adjacent wafers are detected. Thus, a relative position of the conveyor arm to be inserted in the holding chamber and the wafers in the holding chamber can be confirmed.

According to the present invention, light beams parallel to a mounting surface of an arm portion of the conveyor arm apparatus for mounting a wafer are emitted, and the light beams passing through a gap between wafers are detected. Therefore, a distance between wafers and an abnormality of the convey arm can be quickly and reliably checked using the light beams as a probe in a noncontact manner.

The present invention will be apparent from the following detailed description taken in conjunction with the accompanying drawings.

BRIEF DESCRIPTION OF THE DRAWINGS

FIG. 3 is a block diagram showing an electrical circuit for processing an output signal from the light-receiving system shown in FIG. 2;

FIG. 5 is an enlarged view for explaining the positional relationship between a conveyor arm distal end portion, the light-projecting system, and the light-receiving system;

FIG. 6 is a sectional view taken along line VI—VI in FIG. 5;

FIG. 7 is a block diagram schematically showing the first embodiment of the present invention;

FIG. 8B is a flow chart for explaining a wafer storage operation into a wafer carrier;

FIG. 9 is a schematic view showing a second embodiment of the present invention;

FIG. 10 is a partial schematic view of a third embodiment of the present invention; and FIG. 11 is a partial sectional view of the third embodiment.

DESCRIPTION OF THE PREFERRED EMBODIMENTS

Figure 1:
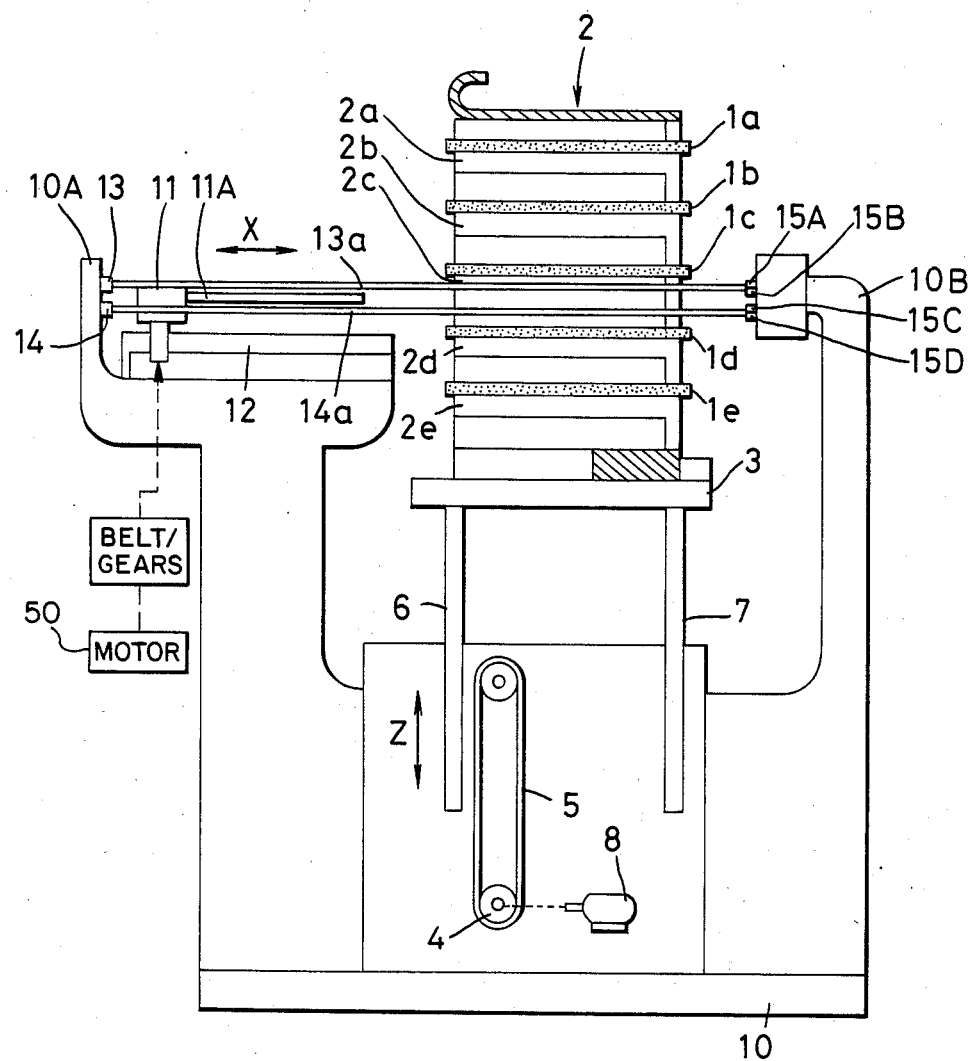
FIG. 1 is a schematic view showing a first embodiment of the present invention.

FIG. 1 shows the arrangement of a first embodiment of the present invention. Referring to FIG. 1, a wafer carrier 2 having a plurality of racks 2a, 2b, 2c, 2d, 2e, . . . for storing a plurality of wafers (FIG. 1 shows five wafers 1a to 1e) one by one is exchangeably mounted at a predetermined position on a vertically movable lift 3. The lift 3 is supported by a supporting column 6, and can be moved in the vertical direction (a direction indicated by arrow Z) along a guide 7 through a belt 5 which has teeth meshed with a gear 4 driven by a motor 8 having reduction gears.

A conveyor arm 11 for loading the wafers 1a to 1e is slidable along a guide 12 fixed to an apparatus main body 10 in a direction indicated by arrow X perpendicular to the moving direction of the lift 3 (the Z direction). As indicated diagrammatically in FIG. 1, conveyor arm 11 is driven by a motor 50, gears, and a belt similar to those of the lift 3. The arm is arranged so that a plate-like arm portion 11A projecting to the right in FIG. 1 may be inserted into the wafer carrier 2. Two semiconductor laser units 13 and 14 which are vertically displaced are arranged on a stationary portion 10A of the apparatus main body 10. Laser means 13a and 14a emitted from the units 13 and 14 propagate along a direction substantially parallel to the sliding direction (the X direction) of the conveyor arm 11. Four photo-electric conversion elements (to be referred to simply as "light-receiving elements" hereinafter) 15A to 15D which are vertically displaced are arranged on a stationary portion 10B of the apparatus main body 10 opposite to the semiconductor laser units 13 and 14 with respect to the wafer carrier 2. The two light-receiving elements 15A and 15B receive the laser beam 13a emitted from one semiconductor laser unit 13, and the remaining two light-receiving elements 15C and 15D receive the laser beam 14a emitted from the other semiconductor laser unit 14.

No lids are arranged on the right and left side surfaces of the wafer carrier 2, as shown in FIG. 1, so that the laser beams 13a and 14a can pass inside the wafer carrier 2. An inner surface distance of the wafer carrier 2 on the right side in a direction perpendicular to the paper of FIG. 1 is narrower than the diameter of the wafers 1a to 1e, so that the wafers 1a to 1e do not fall off to the right side of the wafer carrier 2.

Figure 2A:
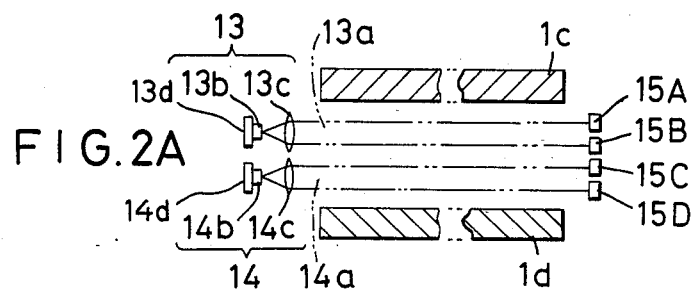
FIGS. 2A to 2D are views for explaining the operation of a light-projecting system and a light-receiving system in the embodiment of FIG. 1.
Figure 2B:
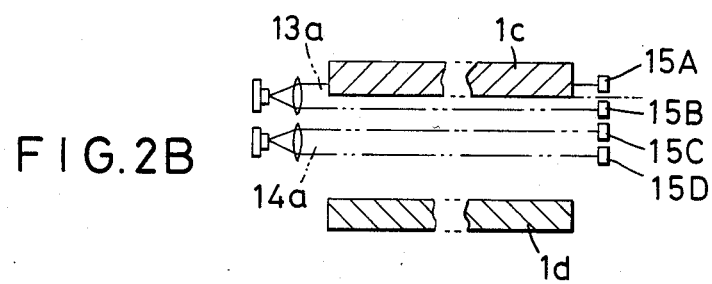

FIGS. 2A to 2D are views for explaining the principle for detecting a wafer gap by means of the laser beams. The vertically arranged semiconductor laser units 13 and 14 respectively comprise semiconductor lasers 13b and 14b, drivers 13d and 14d, and collimator lenses 13c and 14c. When the laser beams 13a and 14a which are collimated to substantially parallel beams by the collimator lenses 13c and 14c pass through a gap between e.g., the wafers 1c and 1d, they are not eclipsed by the wafers 1c and 1d, as shown in FIG. 2A. Therefore, the light-receiving elements 15A and 15B can receive the predetermined amount of the uniform laser beam 13a, and the light-receiving elements 15C and 15D can receive the predetermined amount of the uniform laser beam 14a. As shown in FIG. 2B, when the upper half of the laser beam 13a is eclipsed by the wafer 1c, the laser beam directed to the light-receiving element 15A is cut and cannot be received thereby, and the laser beam is projected onto and is received by only the light-receiving element 15B.

Figure 2C:
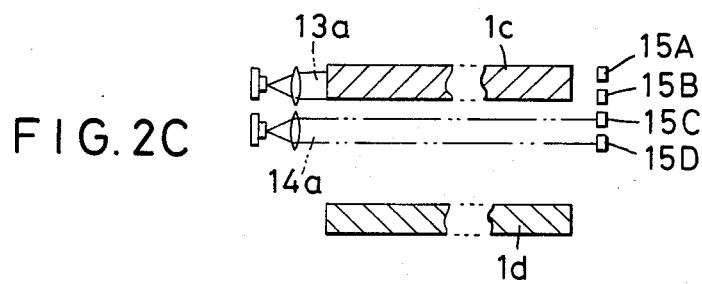
Figure 2D:
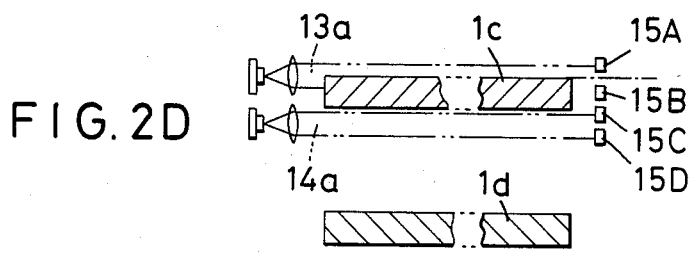

As shown in FIG. 2C, when the laser beam 13a is completely cut by the wafer 1c, the light-receiving elements 15A and 15C receive no light beam. Of course, if the laser beam 13a has a spot size larger than the thickness of the wafer 1c, the light-receiving elements 15A and 15B can receive only the attenuated light beam. As shown in FIG. 2D, when the lower half of the laser beam 13a is eclipsed by the wafer 1c, no laser beam 13a reaches the light-receiving element 15B.

In the above description, the light-receiving state of the light-receiving elements 15A and 15B has been explained when the laser beam 13a is eclipsed by the wafer 1c. The light-receiving state of the light-receiving elements 15C and 15D is quite the same as described above when the laser beam 14a is eclipsed by the wafer 1d, and a description thereof is omitted.

Figure 4:
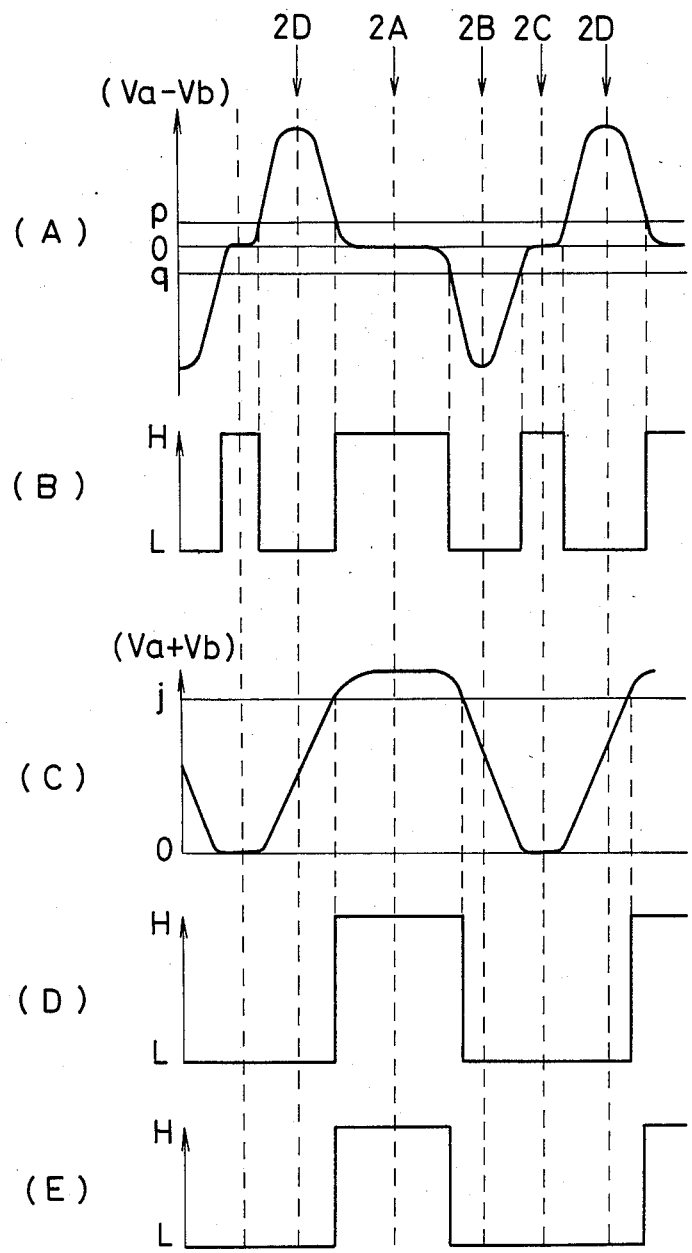
FIG. 4 is a chart showing an electrical signal obtained by the electrical circuit shown in FIG. 3 based on the operation shown in FIG. 2.

FIG. 3 is a block diagram showing an electrical circuit for processing electrical signals output from the light-receiving elements 15A to 15D. FIG. 4 is a waveform chart of the electrical signals output during the operations shown in FIGS. 2A to 2D.

Referring to FIG. 2, photo-electrically converted signals output from the light-receiving elements are converted to voltages by preamplifiers 16, 17, 18, and 19. Voltages Va and Vb, which are obtained from the light-receiving elements 15A and 15B for receiving the laser beam from the semiconductor laser unit 13, and the preamplifiers 16 and 17, are supplied to a subtraction circuit or subtractor 20 to obtain their difference (Va−Vb). Meanwhile, the voltages Va and Vb are supplied to an addition circuit or adder 21 to obtain a voltage (Va+Vb) corresponding to a total amount of received light. The voltages obtained by the subtractor 20 and the adder 21 are respectively compared by comparators 22 and 23 to check if they fall within predetermined reference voltage range. If they fall within the range, a high-level signal (to be referred to as an H-level signal hereinafter) is supplied to an AND gate 24. As for voltages Vc and Vd which are obtained from the light-receiving elements 15C and 15D and corresponding preamplifiers 18 and 19, their difference (Vc−Vd) and sum (Vc+Vd) are calculated by a subtractor 25 and adder 26, and the output voltages therefrom are converted to digital signals by comparators 27 and 28 and are supplied to an AND gate 29, in the same manner as described above.

FIG. 4 shows changes in the output signals (Va-Vb) and (Va+Vb) according to the position of wafer 1a relative to the laser beam 13a as shown in FIG. 1. FIG. 4(A) shows the difference voltage (Va−Vb) corresponding to the outputs from the light-receiving elements 15A and 15B. In a state wherein the laser beam is uniformly projected onto the light-receiving elements 15A and 15B, as shown in FIG. 2A, the output from the subtractor 20 is substantially zero, However, in the state shown in FIG. 2B, no laser light is projected onto one light-receiving element 15A and the laser beam is projected unattenuated entirely onto the other light-receiving element 15B. In contrast to this, in the state shown in FIG. 2D, one light-receiving element 15A receives the laser beam unattenuated, but the other light-receiving element 15B can receive no laser light. Therefore, in the states shown in FIGS. 2B and 2C, one output signal from the light-receiving elements 15A and 15B contributes to the output of the subtractor 20. Therefore, as shown in FIG. 4(A), (2B) represents a minimum value, and (2D) represents a maximum value. At (2C) between (2B) and (2D), the laser beam 13a is cut by the wafer 1c, as shown in FIG. 2C, and cannot reach the light-receiving elements 15A and 15B. Therefore, the output (Va−Vb) from the subtractor 20 becomes almost zero in the same manner as in (2A) in FIG. 4(A).

FIG. 4(B) is a digital waveform chart in which the signal shown in FIG. 4(A) is compared with a predetermined voltage range p-q by the comparator 22, and if the output signal Va−Vb from the subtractor 20 is smaller than p and is larger than q, the outut from the comparator 22 is set at H level. As can be seen from FIG. 4(B), in the states of (2A) and (2C), an H-level signal is output from the comparator 22, and in the state of (2B) and (2D), a low-level signal (to be referred to as an L-level signal hereinafter) is output.

The adder 21 outputs the signal (Va+Vb), as shown in FIG. 4(C). More specifically, only when the laser beam 13a shown in FIG. 2C is shielded by the wafer 1c and cannot reach the light-receiving elements 15A and 15B, the output voltage from the adder 21 becomes a minimum value or 0. For the sake of simplicity, such a state is referred to as "0". The output from the adder 21 becomes a maximum value while the laser beam 13a is not shielded by the wafers 1c and 1d, as shown in FIG. 2A. The sum signal (Va+Vb) shown in FIG. 4(C) is compared with a predetermined reference voltage j by the comparator 23. If the voltage (Va+Vb) is larger than the voltage j, the output from the comparator 23 is set at H level. In this case, a digital signal shown in FIG. 4(D) is output from the comparator 23.

The AND gate 24 which receives the signals shown in FIGS. 4(B) and 4(D) outputs an H-level signal, as shown in FIG. 4(E), only when the laser beam 13a is not cut by the wafer 1c as shown in FIG. 2A. Therefore, the state of output 0 illustrated as (2C) in FIG. 4(A), i.e., the state wherein the laser beam 13a is shielded by the wafer 1c as shown in FIG. 2C can be excluded.

Signals from the light-receiving elements 15C and 15D for receiving the laser beam 14a from the semiconductor laser unit 14 are the same as those from the light-receiving elements 15A and 15B. Note that since the laser beams 13a and 14a are drifted from each other, the signal shown in FIG. 4(E) appears to have a drifted phase. However, when the output signal from the AND gate 24 for the light-receiving elements 15A and 15B and the output signal from the AND gate 29 for the light-receiving elements 15C and 15D go to H level at the same time, the laser beams 13a and 14a emitted from the semiconductor laser units 13 and 4 pass through the space between the wafers 1c and 1d and are not shielded by these wafers 1c and 1d. Therefore, the arm portion 11A of the conveyor arm allowing the laser beams 13a and 14a to pass without contacting the wafers 1c and 1d. More specifically, a gap between wafers which allows insertion of the arm portion 11A of the arm 11 can be reliably detected by the laser beams 13a and 14a in a noncontact manner.

FIG. 5 is a side view showing the relationship between the laser beams 13a and 14a and fin 11B projecting from one side surface of the arm portion 11A. Fin 11B is used in order to check if the arm portion 11A of the conveyor arm 11 is bent. FIG. 6 is a sectional view taken along line VI—VI in FIG. 5. The substantially parallel laser beams 13a and 14a emitted from the semiconductor laser units 13 and 14 pass adjacent to the upper and lower surfaces 11a and 11b of the fin 11B provided on the side surface of the distal end portion of the arm portion 11A of the conveyor arm. An outer width Wo of the laser beams 13a and 14a is larger than a thickness T of the arm portion 11A, as shown in FIG. 6 and is smaller than the wafer gap. Note that an inner distance Wi between the laser beams 13a and 14a is larger than the thickness of the fin 11B.

If the arm portion 11A of the conveyor arm is vertically bent, the fin 11B enters the optical path of either of the laser beams 13a or 14a. As a result, the same phenomenon as the eclipse of the laser beam by the wafers 1a to 1e occurs. More specifically, since the output signal from either the AND gate 24 or 29 shown in FIG. 3 goes to L level, it can be determined if the convey arm 11 is bent. In the embodiment shown in FIGS. 5 and 6, the abnormal displacement of the fin 11B is used to determine if the arm 11 is bent. When the arm portion 11A of the conveyor arm 11 has a thickness smaller than that of the wafer and a wafer gap is large, the laser beams 13a and 14a can pass adjacent to the upper and lower surfaces of the arm portion 11A.

FIG. 7 shows a control system of the apparatus according to the present invention. An AND gate 9 is connected to the output terminals of the AND gates 24 and 29, and outputs a D signal to a controller 49. The controller 49 controls the operation of a driver 61 for driving the motor 8, a driver 60 for driving the motor 50, a display 62, a driver 63 for driving a valve 64, and the drivers 13d and 14d. The valve 64 is connected directly to a vacuum pump and is operated for drawing a wafer by vacuum suction by the arm 11.

Figure 8A:
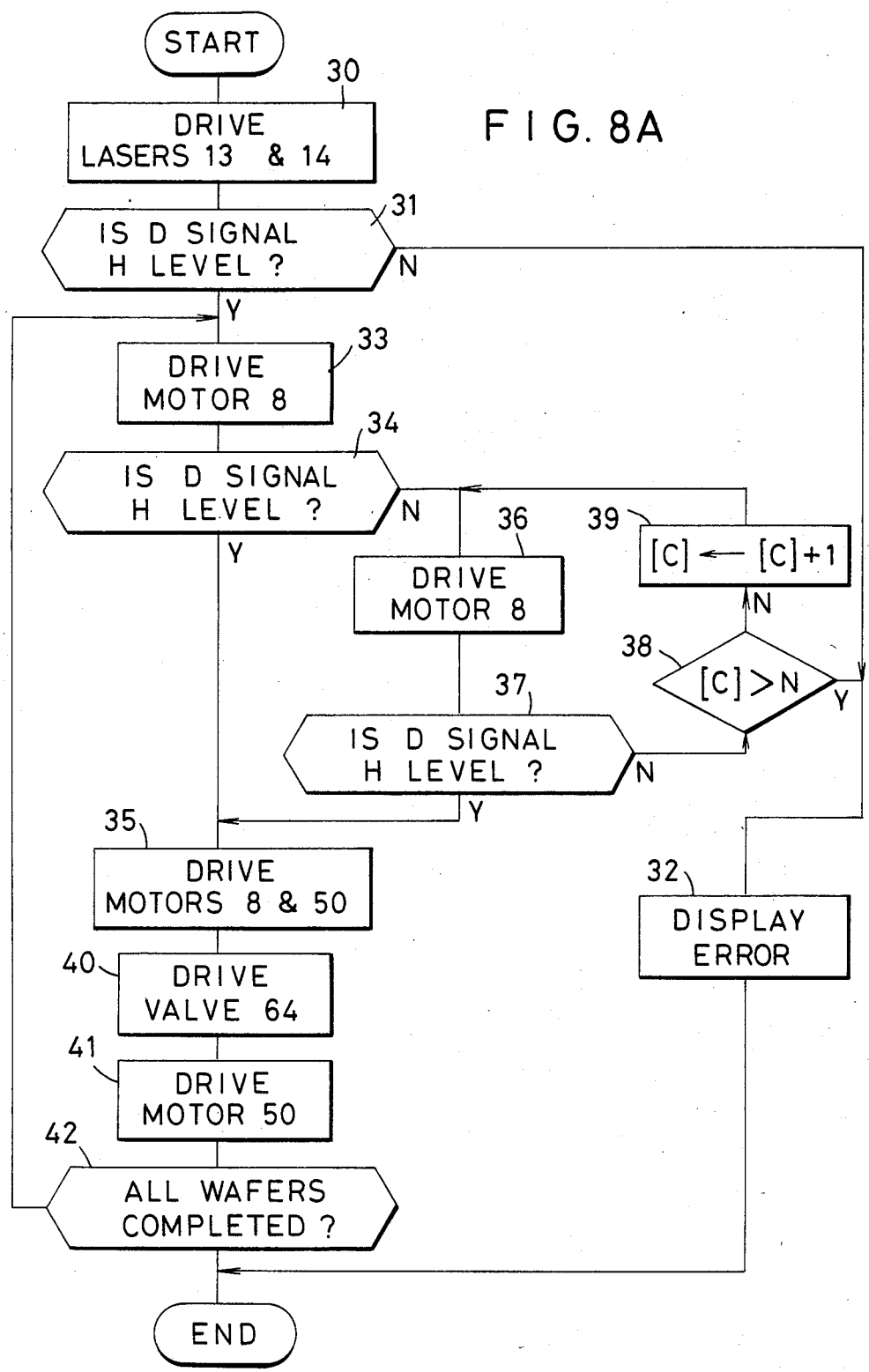
FIG. 8A is a flow chart for explaining a wafer unloading operation.

The wafer loading and unloading operations by the apparatus according to the embodiment shown in FIG. 1 will now be described with reference to the flow charts shown in FIGS. 8A and 8B. FIG. 8A is a flow chart showing the unloading operation for unloading the wafers 1a to 1e from the wafer carrier 2 one by one, and FIG. 8B is a flow chart showing the loading operation of the wafers to the wafer carrier.

Referring to FIG. 8A, the semiconductor laser units 13 and 14 are driven in step 30, and the laser beams 13a and 14a are projected toward the light-receiving elements 15A to 15D. It is then checked in step 31 if the fin 11B shown in FIG. 5. interferes with passage of the laser beams 13a and 14a, i.e., if the arm portion 11A of the convey arm 11 is in a normal state. In this case, if the predetermined amounts of the laser beams 13a and 14a are uniformly projected toward the light-receiving elements 15A, 15B, 15C, and 15D, the outputs from both the AND gates 24 and 29 shown in FIG. 3 go to H level, and hence, the D signal also goes to H level. Otherwise, the output from either the AND gate 24 or 29 goes to L level, and the D signal goes to L level. Thus, the flow advances to step 32, and an error display is made on a display 62, such as a light-emitting diode.

If the D signal is at H level, the wafer unloading operation is performed in accordance with the following steps. First, in step 33, if a processor is instructed so that a designated wafer is to be unloaded from the wafer carrier 2, the lifting devices 4 to 6 are operated to move the lift 3 upward or downward, so that the wafer carrier 2 is moved to a position at which the arm portion 11A of the conveyor arm 11 can be inserted immediately below the designated wafer (e.g., 1c). It is detected by the D signal from the AND gate 9 in step 34 if the predetermined amounts of the uniform laser beams 13a and 14a reach the light-receiving elements 15A to 15D, thereby checking if the wafer gap is large enough to allow insertion of the arm portion 11A of the conveyor arm 11 therethrough. In step 34, if the wafer (e.g., 1c or 1d) contacts the laser beam 13a or 14a, the laser beams toward the light-receiving elements 15A to 15D are partially shielded thereby. Therefore, the laser beams cannot be uniform on the light-receiving elements and cannot provide the predetermined amount of light. Therefore, since the D signal is set at L level, it is determined that it is dangerous to insert the conveyor arm 11 in this state, and then, the flow advances to step 36. If the D signal is at H level in step 34, the flow advances to step 35, and the arm portion 11A of the conveyor arm 11 is inserted through the wafer gap to receive the wafer. The wafer unloading operation is performed as follows. In step 35, after the arm 11 is inserted by driving the motor 50, the wafer carrier 2 is slightly moved downward by driving the motor 8 so as to mount a designated wafer (e.g., 1c) on the arm portion 11A. In step 40, the valve 64 is driven to fix the designated wafer (e.g., 1c) by vacuum suction by a vacuum chuck provided on the upper surface of the arm portion 11A. Then, in step 41, the arm 11 is drawn from the wafer carrier 2 to extract the designated wafer.

In step 34, if the D signal is at L level, it may have been caused by rack portion machining errors of the wafer carrier 2 and resultant variations in distances between adjacent wafers 1a to 1d and/or by improper positioning of a wafer on the rack (2a to 2e) of the wafer carrier 2. However, in the former case, if the height of the wafer carrier 2 with respect to the arm 11 is changed accordingly, wafers can be safely unloaded. In step 36, the motor 8 is driven to slightly vertically move the wafer carrier 2 together with the lift 3, and the wafer gap is checked in step 37 in the same manner as in step 31. In step 36 and 37, the wafer carrier 2 is slightly vertically moved until the D signal goes to H level. Then, the wafer carrier 2 is stopped at a position at which the H-level D signal is produced, or at a position after the wafer carrier 2 is moved in the same direction for a predetermined period of time since the H-level D signal is produced to confirm that the conveyor arm can be safely inserted. Then, the wafer unloading operation in step 35 is performed.

If the flow advances to step 38 from step 37 for checking the wafer gap, the wafer carrier 2 is slightly vertically moved repetitively within the range of the wafer gap. Then, a position capable of obtaining the H-level D signal may be detected. In step 39, a content (C) of an internal counter C of the controller 49 is incremented by one to count the number of operations. It is checked in step 38 if the number of operations falls within a preset number N. If the number of operations exceeds the preset number N, it is determined that insertion of the conveyor arm can no longer be performed even if the wafer carrier 2 is slightly moved, and the flow advances to step 32 to perform an error display. The vertical movement limit can be determined not only by the number of vertical operations but also by a preset time. Alternatively, the operating range of the vertical movement is gradually widened, and when an upper or lower limit is reached, the flow can advance to step 32.

When the wafer is unloaded in step 35, it is conveyed to a predetermined process. It is checked in step 42 if transfer of all the wafers to be conveyed is completed. If a designated wafer remains in step 42, the flow returns to step 33, and the lifting operation of the wafer carrier 2 and designated wafer search are performed. If no designated wafer remains, the series of operations is completed.

The operation for loading a wafer on the wafer carrier 2 will now be described with reference to the flow chart shown in FIG. 8B. In step 43, the motor 8 is driven to move the wafer carrier 2 so that the upper surface of the arm portion 11A of the arm 11 carrying the wafer (e.g., 1c) is located at a position slightly higher than the upper surface of the rack (e.g., 2c) of the wafer carrier 2 so as to allow safe loading of the wafer into the wafer carrier 2. Thereafter, in step 44, the arm portion 11A of the conveyor arm 11 is inserted in the wafer carrier 2. In step 45, the valve 64 is driven to release vacuum suction of the wafer by the vacuum chuck arranged on the upper surface of the arm portion 11A of the arm 11. Subsequently, in step 46, the motor 8 is driven to slightly move the wafer carrier 2 upward and the wafer (e.g., 1c) placed on the arm portion 11A of the convey arm 11 is transferred onto the rack (e.g., 2c) of the wafer carrier 2.

When the wafer is transferred to the wafer carrier 2 in step 46, a wafer gap checking operation is immediately performed. Step 47 is the same as steps 32, 34 and 36-39 in FIG. 8A. More specifically, it is checked by means of the D signal if the predetermined amounts of the uniform laser beams 13a and 14a reach the light-receiving element 15A to 15D, in the same manner as in step 37. If the D signal is at H level, when the conveyor arm 11 is drawn, the arm portion 11A does not contact wafers (e.g., 1c and 1d) which are present above and below the arm portion 11A. Therefore, in step 48, the convey arm 11 is drawn from the wafer carrier 2, thus completing the operation. Even if the D signal is at L level, this may be caused by variations in height of the wafer racks due to machining errors of the wafer carrier 2 as discussed in connection with the wafer unloading operation. Thus, the operations shown in steps 32, 36, 37, 38 and 39 are performed.

As described above, in the wafer unloading operation and the wafer loading operations as shown in FIGS. 8A and 8B, the height of the wafer carrier 2 is precisely set with respect to the conveyor arm. Alternatively, after the height of the wafer carrier is changed to a given value, the wafer gap checking sequence is performed by the light-receiving elements 15A and 15B for receiving the laser beam 13a and the light-receiving elements 15C and 15D for receiving the laser beam 14a, and the wafer carrier 2 can be vertically moved so that both the AND gates 24 and 29 generate H-level signals. In this case, it is convenient that the wafer carrier 2 can be moved upward or downward in accordance with the sign of the outputs from the subtractors 20 and 25.

Note that when the wafer carrier 2 is vertically moved, the number of wafers in the carrier 2 can be counted according to the number of times the sum signal $(Va+Vb)$ or $(Vc+Vd)=0$. During this vertical movement, if the sum signal $(Va+Vb)$ or $(Vc+Vd)$ does not yield 0, wafers ($1a$ to $1e$) are not stored in the corresponding racks $2a$ to $2e$ in the wafer carrier 2.

FIG. 9 is a schematic view showing a second embodiment of the present invention different from FIG. 1. FIG. 9 only shows a conveyor arm 51, and laser projecting and receiving systems. In this case, a single semiconductor laser unit 52 is arranged on a stationary portion 10A of an apparatus main body 10 in the same manner as in the first embodiment shown in FIG. 1, and a corner cube prism 53 for parallel-reflecting a laser beam 52a in an opposite direction is fixed on the side opposite to the semiconductor laser unit 52 with respect to the wafer carrier 2. A reflected beam 52b reflected by the corner cube prism 53 is received by a pair of light-receiving elements 54A and 54B arranged on the stationary portion 10A. Output signals from the light-receiving elements 54A and 54B are processed by a subtractor 20, an adder 21, comparators 22 and 23, and an AND gate 24 in the same manner as those from the light-receiving elements 15A and 15B.

In the embodiment shown in FIG. 9, two semiconductor laser units need not be arranged on the stationary portion 10A, and only two (a pair of) light-receiving elements need be used. Therefore, the overall arrangement can be considerably simplified. If either the laser beam 52a on the projection side or the laser beam 52b on the reflection side is shielded, an abnormality occurs in an output signal from either of the light-receiving elements 54A and 54B. Therefore, wafer gap checking operation or conveyor arm checking operation can be performed in the same manner as in the embodiment shown in FIG. 1.

Note that in the embodiments shown in FIGS. 1 and 9, a plurality of wafers are stored in the wafer carrier 2 so as to replaceable with other wafers together with a storing chamber. Alternatively, with a wafer holding chamber fixed to the lift 3, the apparatus of the present invention by means of light beams can also be applied.

In the first and second embodiments shown in FIGS. 1 and 9, the semiconductor laser units 13, 14, and 52 are fixed to the stationary portion 10A of the apparatus main body 10, but they can be fixed to another stationary portion. Since the conveyor arms 11 and 51 and the wafer carrier 2 require only a relative vertical positional relationship, the arm 11 or 51 can be vertically moved instead of vertically moving the wafer carrier 2. In this case, the semiconductor laser units 13, 14, and 52, the light-receiving elements 15A to 15D, 54A and 54B, and the corner cube prism 53 can be vertically moved together with the conveyor arm 11 or 51. Thin parallel incoherent light beams can be used instead of the laser beams 13a, 14a, 52a, and 52b. Modulation and demodulation can be performed so that light beams are generated with specific pulse widths so as not to erroneously receive a wrong light beam. The present invention is not limited to conveyance of wafers, and can be applied to other substrates (masks or reticles).

FIGS. 10 and 11 show a third embodiment of the present invention. In this embodiment, in order to detect bending of a conveyor arm 110, projections 110A and 110B are formed on the arm 110, and it is determined by the output from light-receiving elements 150A and 150B if a laser beam 130a emitted from a semiconductor laser unit 130 can pass between the projections 110A and 110B. The laser beam 130a is expanded to a laser beam 130b by a beam expander 70. The width of the laser beam 130b is determined so that a distance between adjacent wafers in a wafer carrier 2 can be measured in the same manner as in the first and second embodiments. The width of the light beam 130b in the third embodiment corresponds to that of an area through which two light beams pass in the first and second embodiments.

In the above embodiments, in order to detect a single laser beam from the semiconductor laser unit, a pair of light-receiving elements are arranged. Also, for example, a one-dimensional image sensor for detecting two light beams can be arranged. Since the one-dimensional image sensor can accurately measure a wide range of light intensity distribution, inclination or type of wafers stored in the carrier 2 can be discriminated from a pattern of the light intensity distribution according to scattered light or diffracted light from the surface of the wafers.

We claim:

1. An apparatus for unloading a carrier means in which a plurality of substrates are stored substantially parallel to each other in locations spaced by a predetermined distance, comprising:
   (a) stage means on which said carrier means is disposed;
   (b) an arm member provided with a mounting surface for receiving each of said plurality of substrates, said arm member being formed such that said mounting surface is substantially parallel to each of said plurality of substrates stored in said carrier means;
   (c) moving means for moving said arm member in a predetermined direction to insert a part of said arm member into a gap between adjacent ones of said plurality of substrates in said carrier means, said part of said arm member having said mounting surface, said predetermined direction being substantially parallel to said mounting surface;
   (d) light detecting means;
   (e) projecting means for projecting a pair of light beams to said light detecting means such that the light paths of said light beams are substantially parallel to said mounting surface with one of said light beams being disposed opposite to the other of said light beams with respect to said part of said arm member in a direction transverse to said mounting surface, said light detecting means being disposed at an opposite side of said stage means in said predetermined direction with respect to said projecting means, said light detecting means detecting intensity of each of said light beams and outputting light detecting signals corresponding to the detected intensities;
   (f) substrate detecting means responsive to said light detecting signals for detecting that at least one of said plurality of substrates stored in said carrier means is in at least one of said light paths, and for outputting a substrate detecting signal; and
   (g) control means responsive to said substrate detecting signal for causing relative displacement between said arm member and said stage means along a direction which is substantially perpendicular to said predetermined direction.

2. An apparatus according to claim 1, wherein said projecting means projects said light beams such that they are arranged substantially in a plane containing said transverse direction.

3. An apparatus according to claim 1, wherein said light beams pass through an area having a width which, in the direction perpendicular to said predetermined direction, is smaller than said predetermined distance.

4. An apparatus according to claim 1, wherein said light detecting means has two pairs of photoelectric conversion elements, and wherein each of said two pairs corresponds to a respective one of said light beams.

5. An apparatus according to claim 4, wherein said substrate detecting means has means for producing difference signals corresponding to the differences between the outputs of the photoelectric conversion elements of each of said two pairs, means for producing sum signals corresponding to the sums of the outputs of the photoelectric conversion elements of each of said two pairs, and means for producing said substrate detecting signal on the basis of said difference signals and said sum signals.

6. An apparatus according to claim 1, wherein said substrates are stored in a substantially vertical arrangement in said carrier means.

7. An apparatus for unloading a carrier means in which a plurality of substrates are stored substantially parallel to each other in locations spaced by a predetermined distance, comprising:
   (a) stage means on which said carrier means is disposed;
   (b) an arm member provided with a mounting surface for receiving each of said plurality of substrates, said arm member being formed so that said mounting surface is substantially parallel to each of said plurality of substrates stored in said carrier means;
   (c) moving means for moving said arm member in a predetermined direction to insert a part of said arm member into a gap between adjacent ones of said plurality of substrates in said carrier means, said part of said arm member having said mounting surface, said predetermined direction being substantially parallel to said mounting surface;
   (d) light positioning means having projecting means for projecting a light beam through said carrier means to reflecting means disposed at an opposite side of said stage means with respect to said projecting means for reflecting said light beam back through said carrier means, said light positioning means positioning said projected light beam and said reflected light beam such that light paths of said projected light beam and said reflected light beam are substantially parallel to said mounting surface and said projected light beam is opposite to said reflected light beam with respect to said arm member;

(e) light detecting means for detecting intensity of light of said reflected light beam that passes through said carrier means and for outputting a light detecting signal corresponding to the detected intensity;

(f) substrate detecting means responsive to said light detecting signal for detecting that at least one of said plurality of substrates stored in said carrier means is in one of said light paths, and for outputting a substrate detecting signal; and (g) control means responsive to said substrate detecting signal for causing a relative displacement between said arm member and said stage means along a direction which is substantially perpendicular to said predetermined direction.

8. An apparatus according to claim 7, wherein said light detecting means has a pair of photoelectric conversion elements.

9. An apparatus according to claim 8, wherein said substrate detecting means has means for producing a difference signal corresponding to the difference between the outputs of said photoelectric conversion elements, means for producing a sum signal corresponding to the sum of the outputs of said photoelectric conversion elements, and means for producing said substrate detecting signal on the basis of said difference signal and said sum signal.

10. An apparatus according to claim 7, wherein said reflecting means directs said reflected light beam substantially parallel to said projected light beam.

11. An apparatus according to claim 7, wherein said projected light beam and said reflected light beam pass through an area which, in the direction perpendicular to said predetermined direction, has a width smaller than said predetermined distance.

12. An apparatus according to claim 7, wherein said substrates are stored in a substantially vertical arrangement in said carrier means.

13. An apparatus for unloading a carrier means, in which a plurality of substrates are stored substantially parallel to each other in locations spaced by a predetermined distance, comprising:

(a) stage means on which said carrier means is disposed;

(b) an arm member provided with a mounting surface for receiving each of said plurality of substrates, said arm member being formed so that said mounting surface is substantially parallel to each of said plurality of substrates stored in said carrier means;

(c) moving means for moving said arm member in a predetermined direction to insert a part of said arm member into a gap between adjacent ones of said plurality of substrates in said carrier means, said part of said arm member having said mounting surface, said predetermined direction being substantially parallel to said mounting surface;

(d) a fin member projecting from said arm member in a direction which extends along said mounting surface and across said predetermined direction;

(e) projecting means for projecting two light beams through said carrier means such that light path of said beams are substantially parallel to said mounting surface and one of said two light beams is opposite to the other of said two light beams with respect to said fin member;

(f) light detecting means for detecting the intensities of said two light beams passed through said carrier means and for outputting light detecting signals corresponding to the detected intensities; and (g) discriminating means responsive to said light detecting signals for detecting that said fin member interferes with at least one of said two light beams and generating an error signal.

14. An apparatus according to claim 13, which further comprises display means for displaying that said error signal is generated.

15. An apparatus according to claim 13, wherein said fin member extends in a direction which is substantially the same as said predetermined direction, and said fin member projects from said arm member in a direction which is substantially perpendicular to said predetermined direction.

16. An apparatus according to claim 13, which further comprises substrate detecting means responsive to said light detecting signal for detecting that at least one of said plurality of substrates stored in said carrier means is in at least one of the light paths of said two light beams and outputting a substrate detecting signal, and control means responsive to said substrate detecting signal for causing relative displacement between said arm member and said stage means along a direction which is substantially perpendicular to said predetermined direction.

17. An apparatus according to claim 13, wherein said substrates are stored in a substantially vertical arrangement in said carrier means.

18. An apparatus for unloading a carrier means in which a plurality of substrates are stored substantially parallel to each other in locations spaced by a predetermined distance, comprising:

(a) stage means on which said carrier means is disposed;

(b) an arm member provided with a mounting surface for receiving each of said plurality of substrates, said arm member being formed so that said mounting surface is substantially parallel to each of said plurality of substrates stored in said carrier means;

(c) moving means for moving said arm member in a predetermined direction to insert a part of said arm member into gap between adjacent ones of said plurality of substrates in said carrier means, said part of said arm member having said mounting surface, said predetermined direction being substantially parallel to said mounting surface;

(d) a fin member projecting from said arm member in a direction which extends along said mounting surface and across said predetermined direction;

(e) light positioning means having projecting means for projecting a light beam through said carrier means to reflecting means disposed at an opposite side of said projecting means for reflecting said light beam back through said carrier means, said light positioning means positioning said projected light beam and said reflected light beam such that light paths of said projected light beam and said reflected light beam are substantially parallel to said mounting surface with said projected light beam and said reflected light beam being opposite one another with respect to said fin member;

(f) light detecting means for detecting intensity of light of said reflected light beam that passes through said carrier means and outputting a light detecting signal corresponding to the detected intensity; and (g) discriminating means responsive to said light detecting signal for detecting that said fin member interferes with at least one of said projected light beam and said reflected light beam and generating an error signal.

19. An apparatus according to claim 18, which further comprises display means for displaying that said error signal is generated.

20. An apparatus according to claim 18, wherein said fin member extends in a direction which is substantially the same as said predetermined direction, and said fin member projects from said arm member in a direction which is substantially perpendicular to said predetermined direction.

21. An apparatus according to claim 18, which further comprises substrate detecting means responsive to said light detecting signal for detecting that at least one of said plurality of substrates stored in said carrier means is in at least one of said projected light beam and said reflected light beam and outputting a substrate detecting signal, and control means responsive to said substrate detecting signal for causing relative displacement between said arm member and said stage means along a direction which is substantially perpendicular to said predetermined direction.

22. An apparatus according to claim 18, wherein said substrates are stored in a substantially vertical arrangement in said carrier means.

23. An apparatus for unloading a carrier means in which a plurality of substrates are stored substantially parallel to each other at locations spaced by a predetermined distance comprising:

(a) stage means on which said carrier means is disposed;

(b) an arm member provided with a mounting surface and a light inhibiting member, said mounting surface being substantially parallel to and configured to receive each of said plurality of substrates stored in said carrier means, said inhibiting member being disposed in a predetermined area which has a width in a direction transverse to said mounting surface;

(c) moving means for moving said arm member in a predetermined direction to insert a part of said arm member into a gap between adjacent ones of said plurality of substrates in said carrier means, said part of said arm member having said mounting surface, said predetermined direction being substantially parallel to said mounting surface;

(d) projecting means for projecting a light beam through said carrier means and said predetermined area in a direction which is substantially parallel to said mounting surface, said inhibiting member being adapted to interfere with said light beam if said arm member is deformed such that said mounting surface is not substantially parallel to said plurality of substrates;

(e) light detecting means for detecting intensity of light of said light beam that passes through said predetermined area and for outputting a light detecting signal corresponding to the detected intensity; and (f) discriminating means responsive to said light detecting signal for detecting that said light inhibiting member interferes with said light beam and generating an error signal.

24. An apparatus according to claim 23, which further comprises display means for displaying that said error signal is generated.

25. An apparatus according to claim 24, which further comprises substrate detecting means responsive to said light detecting signal for detecting that at least one of said plurality of substrates stored in said carrier means is in at least one of said projected light beam and said reflected light beam and outputting a substrate detecting signal, and control means responsive to said substrate detecting signal for causing relative displacement between said arm member and said stage means along a direction which is substantially perpendicular to said predetermined direction.

26. An apparatus according to claim 25, wherein said substrates are stored in a substantially vertical arrangement in said carrier means.

27. An apparatus for unloading substrates from a carrier in which the substrates are stored substantially parallel to each other at locations spaced by a predetermined amount so as to define substantially parallel gaps of predetermined width between the substrates, comprising:

(a) stage means for mounting the carrier thereto;

(b) conveyor arm means having an arm portion adapted to receive and convey the substrates thereon, said arm portion having a thickness in a direction transverse to said substrates smaller than said predetermined width;

(c) means for moving said conveyor arm means relative to said storage means to insert said arm portion into said gaps, selectively;

(d) projecting means for beaming light through a selected gap in directions substantially parallel to said substrates at opposite sides of the thickness of said arm portion;

(e) light intensity detecting means for receiving light beamed through said gap by said projecting means and for detecting a reduction of intensity in the light received; and (f) means responsive to said detecting means for determining whether said gap is positioned relative to said arm portion such that said arm portion may be inserted into said gap without contacting substrates adjacent to the gap.

28. An apparatus according to claim 27, comprising means responsive to said determining means for adjusting the position of said stage means relative to said conveyor means as necessary to enable said arm portion to be inserted into said gap without contacting the adjacent substrates.

29. An apparatus according to claim 27, wherein said projecting means projects two beams of light through said gap from one side of said carrier, said two beams are disposed to either side of the thickness of said arm portion, and said detecting means includes means disposed to an opposite side of said carrier for detecting the intensity of light of each beam.

30. An apparatus according to claim 27, wherein said projecting means comprises means disposed to one side of said carrier for directing a beam of light through said gap at one side of the thickness of said arm portion, and reflector means disposed to an opposite side of said carrier for reflecting the directed beam back through said gap at the other side of the thickness of said arm portion, and wherein said detecting means comprises means for detecting intensity of light of said reflected beam that passes through said gap.

31. An apparatus according to claim 27, wherein said conveyor arm means includes means for interfering with light beamed by the projecting means should said conveyor arm means be deformed such that said arm portion cannot be inserted into said gap without contacting one of the adjacent substrates.

32. An apparatus according to claim 31, wherein said interfering means comprises a projecting fin.

* * * * *